United States Patent
Zhu et al.

(10) Patent No.: US 12,396,129 B2
(45) Date of Patent: Aug. 19, 2025

(54) LIQUID-COOLING HEAT DISSIPATION SYSTEM, CONTROL METHOD, APPARATUS AND DEVICE FOR SERVERS

(71) Applicant: Suzhou MetaBrain Intelligent Technology Co., Ltd., Jiangsu (CN)

(72) Inventors: Huanlai Zhu, Jiangsu (CN); An Wu, Jiangsu (CN); Guangzhi Liu, Jiangsu (CN)

(73) Assignee: Suzhou MetaBrain Intelligent Technology Co., Ltd., Jiangsu (CN)

( * ) Notice: Subject to any disclaimer, the term of this patent is extended or adjusted under 35 U.S.C. 154(b) by 0 days.

(21) Appl. No.: 18/867,928

(22) PCT Filed: Mar. 30, 2023

(86) PCT No.: PCT/CN2023/085273
§ 371 (c)(1),
(2) Date: Nov. 21, 2024

(87) PCT Pub. No.: WO2024/093116
PCT Pub. Date: May 10, 2024

(65) Prior Publication Data
US 2025/0176133 A1 May 29, 2025

(30) Foreign Application Priority Data
Oct. 31, 2022 (CN) .......................... 202211341959.2

(51) Int. Cl.
H05K 7/20 (2006.01)
(52) U.S. Cl.
CPC ..... H05K 7/20272 (2013.01); H05K 7/20263 (2013.01); H05K 7/20772 (2013.01); H05K 7/20836 (2013.01)

(58) Field of Classification Search
CPC .......... H05K 7/20272; H05K 7/20263; H05K 7/20772; H05K 7/20836
(Continued)

(56) References Cited

U.S. PATENT DOCUMENTS 9,335,802 B2 * 5/2016 Shelnutt ................. H05K 7/203
9,351,429 B2 * 5/2016 Shelnutt ................. H05K 7/203
(Continued)

FOREIGN PATENT DOCUMENTS

| CN | 108601314 A | 9/2018 |
| CN | 111263878 A | 6/2020 |

(Continued)

OTHER PUBLICATIONS

International Search Report of corresponding PCT application (PCT/CN2023/085273) mailed Jul. 6, 2023, 7 pages.
(Continued)

*Primary Examiner* — Joel M Attey
(74) *Attorney, Agent, or Firm* — Cooper Legal Group, LLC

(57) ABSTRACT

A liquid-cooling heat dissipation system and control method for servers are provided. The system includes: a heat exchanger, a vacuum generator, and n liquid-cooling tank bodies. A liquid-cooling heat dissipation mode of at least one liquid-cooling tank body is spraying heat dissipation, and at least two liquid-cooling tank bodies have different liquid-cooling heat dissipation modes. The first liquid-cooling tank body includes a first liquid storage tank configured to store cooling liquid, the $i^{th}$ liquid-cooling tank body is connected with the $(i+1)^{th}$ liquid-cooling tank body by means of the heat exchanger, and the $n^{th}$ liquid-cooling tank body is connected with the first liquid storage tank.

16 Claims, 4 Drawing Sheets

(58) Field of Classification Search
USPC .......................................................... 165/80.4
See application file for complete search history.

(56) References Cited

U.S. PATENT DOCUMENTS

| | | |
|---|---|---|
| 2012/0180979 A1 | 7/2012 | Harrington |
| 2015/0049432 A1* | 2/2015 | Best ........................ G06F 1/206 165/104.31 |
| 2016/0014932 A1* | 1/2016 | Best .......................... G06F 1/20 361/679.53 |
| 2019/0297754 A1 | 9/2019 | Avalos Garcia et al. |
| 2021/0068303 A1 | 3/2021 | Franz et al. |

FOREIGN PATENT DOCUMENTS

| | | |
|---|---|---|
| CN | 114138084 A | 3/2022 |
| CN | 114867312 A | 8/2022 |
| CN | 115407848 A | 11/2022 |

OTHER PUBLICATIONS

Written Opinion of International Searching Authority of corresponding PCT application (PCT/CN2023/085273), mailed Jul. 6, 2023, 10 pages.

First Office Action of corresponding CN priority application (CN202211341959.2), mailed Dec. 7, 2022, 7 pages.

Notification to Grant Patent Right for Invention of corresponding CN priority application (CN202211341959.2), mailed Jan. 10, 2023, 3 pages.

\* cited by examiner

LIQUID-COOLING HEAT DISSIPATION SYSTEM, CONTROL METHOD, APPARATUS AND DEVICE FOR SERVERS

CROSS-REFERENCE TO RELATED APPLICATION

This application claims priority to Chinese Patent Application No. 202211341959.2, filed on Oct. 31, 2022 in China National Intellectual Property Administration and entitled "LIQUID-COOLING HEAT DISSIPATION SYSTEM, CONTROL METHOD, APPARATUS AND DEVICE FOR SERVERS", which is hereby incorporated by reference in its entirety.

FIELD

The present application relates to the technical field of single-phase liquid cooling, and in particular to, a liquid-cooling heat dissipation system for servers, control method, control apparatus, and control device, and a non-volatile readable storage medium.

BACKGROUND

With the implementation of China's national big data strategy and national strategy for accelerating the construction of digital China and the booming of cloud computing and big data, the explosive growth of data volume promotes the rapid development of data center market. However, the construction of data center is always hindered by environmental issues such as large energy consumption, whereby the construction of green data center is an inevitable development trend. In order to meet the ever-increasing demand for computing power, the power density of a single cabinet is increasingly high, while air cooling systems are approaching cost-effective cooling limits at present. Based on this, the data center liquid-cooling heat dissipation technology with low Power Usage Effectiveness (PUE, an index for evaluating the energy efficiency of a data center) and high heat dissipation density was developed.

Currently, the single-phase liquid-cooling technology includes cold-plate liquid cooling, immersion liquid cooling, and spraying liquid cooling, etc. The mainstream single-phase cold-plate liquid-cooling technology usually only covers high-power-consumption components such as Central Processing Unit (CPU), Graphics Processing Unit (GPU), and Dual-Inline-Memory-Modules (DIMM), and other components, such as hard disk and network card, still depend on air cooling. Therefore, it is difficult to reduce the PUE to below 1.2. The single-phase immersion liquid-cooling technology can cover all components of a server, and the PUE may be 1.1. However, because of the bathtub effect of single-phase immersion liquid cooling, a large amount of expensive cooling liquid is needed, whereby the cost is extremely high during actual application. The single-phase spraying liquid-cooling technology can cover all heat-generating components in the server. At the same time, due to a spraying effect, the cooling liquid required by single-phase spray liquid cooling technology is about 20% of that of single-phase immersion liquid cooling. Due to a spraying impact effect, the directed precise and effective heat dissipation for a local heating spot can be realized, and the heat exchanging efficiency is higher than that of immersion liquid cooling.

In the existing technology, a spraying liquid-cooling heat dissipation system needs to be driven by a circulating pump, positive pressure is formed inside the system, and the internal operating pressure is higher than the ambient atmospheric pressure, whereby the requirement on the system tightness is extremely high when in use. Once the system is in a situation of cracking or loosening at some place, the expensive cooling liquid may leak, which may further lead to the failure of heat dissipation of the system. Particularly, when the cooling liquid is a flammable working medium, cooling liquid leakage may cause the safety risk of fire. Therefore, how to reduce the risk of cooling liquid leakage of a spraying liquid-cooling heat dissipation system and reduce the resulting heat dissipation failure and potential fire risk is an urgent problem to be solved at present.

SUMMARY

The present application aims to provide a liquid-cooling heat dissipation system, control method, control apparatus and control device for servers, and a non-volatile readable storage medium so as to reduce the risk of cooling liquid leakage of a spraying liquid-cooling heat dissipation system, which can realize the reasonable hierarchical heat dissipation by combining a plurality of various heat dissipation modes.

To solve the above technical problems, the present application provides a liquid-cooling heat dissipation system for servers, which includes: a heat exchanger, a vacuum generator, and n liquid-cooling tank bodies, wherein n is a positive integer greater than or equal to 2, a liquid-cooling heat dissipation mode of at least one liquid-cooling tank body is spraying heat dissipation, and at least two liquid-cooling tank bodies have different liquid-cooling heat dissipation modes.

Wherein, a first liquid-cooling tank body comprises a first liquid storage tank configured to store cooling liquid, the $i^{th}$ liquid-cooling tank body is connected with the $(i+1)^{th}$ liquid-cooling tank body by means of the heat exchanger, and the $n^{th}$ liquid-cooling tank body is connected with the first liquid storage tank; the heat exchanger is configured to cool the cooling liquid flowing through the heat exchanger; a vacuum port of the vacuum generator is connected with the n liquid-cooling tank bodies and the first liquid storage tank, respectively, and configured to control and regulate a vacuum degree of the liquid-cooling tank bodies and the first liquid storage tank, whereby the cooling liquid in the first liquid storage tank passes through the first liquid-cooling tank body to the nth liquid-cooling tank body successively and flows back to the first liquid storage tank, and/or passes through the nth liquid-cooling tank body to the first liquid-cooling tank body successively and flow back to the first liquid storage tank; each of the liquid-cooling tank bodies is configured to cool a server in respective tank body by using the cooling liquid flowing out of the heat exchanger or the first liquid storage tank; and i is a positive integer less than or equal to n−1.

In some embodiments, a $m^{th}$ liquid-cooling tank body further comprises a second liquid storage tank configured to store the cooling liquid.

Wherein, m is a positive integer greater than 1 and less than or equal to n. The first liquid storage tank is connected with the first liquid-cooling tank body by means of a first valve, the $n^{th}$ liquid-cooling tank body is connected with the first liquid storage tank by means of a second valve, the second liquid storage tank is connected to the $m^{th}$ liquid-cooling tank body by means of a third valve, and the second liquid storage tank is connected with the first liquid-cooling tank body by means of a fourth valve.

The vacuum port of the vacuum generator is connected with the second liquid storage tank and configured to control and regulate a vacuum degree of the second liquid storage tank and the first liquid-cooling tank body to the $m^{th}$ liquid-cooling tank body when the first valve and the second valve are closed and the third valve and the fourth valve are opened, whereby the cooling liquid in the second liquid storage tank passes through the first liquid-cooling tank body to the $m^{th}$ liquid-cooling tank body and flows back to the second liquid storage tank, and/or passes through the $m^{th}$ liquid-cooling tank body to the first liquid-cooling tank body successively and flows back to the second liquid storage tank.

In some embodiments, m=n. The vacuum generator is configured to control and regulate the vacuum degree of the first liquid storage tank and the first liquid-cooling tank body to the $n^{th}$ liquid-cooling tank body when the first valve and the second valve are opened and the third valve and the fourth valve are closed, whereby the cooling liquid in the first liquid storage tank passes through the first liquid-cooling tank body to the $n^{th}$ liquid-cooling tank body and flows back to the first liquid storage tank, and/or passes through the $n^{th}$ liquid-cooling tank body to the first liquid-cooling tank body successively and flows back to the first liquid storage tank; and to control and regulate the vacuum degree of the second liquid storage tank and the first liquid-cooling tank body to the $n^{th}$ liquid-cooling tank body when the first valve and the second valve are closed and the third valve and the fourth valve are opened, whereby the cooling liquid in the second liquid storage tank passes through the first liquid-cooling tank body to the $n^{th}$ liquid-cooling tank body and flows back to the second liquid storage tank, and/or passes through the $n^{th}$ liquid-cooling tank body to the first liquid-cooling tank body successively and flows back to the second liquid storage tank.

In some embodiments, the first liquid storage tank includes: a first circulating pump, configured to pump the cooling liquid in the first liquid storage tank to the first liquid-cooling tank body. An outlet of the first circulating pump is connected to the first liquid-cooling tank body by means of the first valve.

The second liquid storage tank includes: a second circulating pump, configured to pump the cooling liquid in the second liquid storage tank to the $m^{th}$ liquid-cooling tank body. An outlet of the second circulating pump is connected to the $m^{th}$ liquid-cooling tank body by means of the third valve.

In some embodiments, m=n=2.

In some embodiments, a liquid-cooling heat dissipation mode of the first liquid-cooling tank body is spraying heat dissipation, and the first liquid-cooling tank body includes:
  a jet nozzle, configured to spray a server in the tank body by using the cooling liquid flowing out of a first liquid-cooling exchange port of the first liquid-cooling tank body or the first liquid storage tank to cool the server in the tank body. The first liquid storage tank is connected to the jet nozzle by means of the first valve, the first liquid-cooling exchange port of the first liquid-cooling tank body is connected to the jet nozzle, the first liquid-cooling exchange port of the first liquid-cooling tank body is connected to a first input/output port of the heat exchanger by means of a fifth valve, a second liquid-cooling exchange port of the first liquid-cooling tank body is connected to the first input/output port by means of a sixth valve, and a second input/output port of the heat exchanger is connected with the second liquid-cooling tank body.

In some embodiments, a liquid-cooling heat dissipation mode of the second liquid-cooling tank body is immersion heat dissipation. A first liquid-cooling exchange port of the second liquid-cooling tank body is connected with the second input/output port of the heat exchanger, a second liquid-cooling exchange port of the second liquid-cooling tank body is connected with the first liquid storage tank, and the second liquid storage tank is connected with a third liquid-cooling exchange port of the first liquid-cooling tank body.

In some embodiments, the vacuum port of the vacuum generator is connected with the first liquid-cooling tank body successively by means of a seventh valve and an eighth valve, the vacuum port of the vacuum generator is connected with the second liquid-cooling tank body successively by means of a ninth valve and a tenth valve, the vacuum port of the vacuum generator is connected with the first liquid storage tank successively by means of the ninth valve and an eleventh valve, and the vacuum port of the vacuum generator is connected with the second liquid storage tank successively by means of the seventh valve and a twelfth valve.

In some embodiments, when m is not equal to n, the second liquid storage tank is connected with the $n^{th}$ liquid-cooling tank body by means of a thirteenth valve.

The vacuum generator is also configured to control and regulate a vacuum degree of the second liquid storage tank and the $m^{th}$ liquid-cooling tank body to the $n^{th}$ liquid-cooling tank body when the first valve, the second valve, and the fourth valve are closed and the third valve and the fifth valve are opened, whereby the cooling liquid in the second liquid storage tank passes through the $m^{th}$ liquid-cooling tank body to the $n^{th}$ liquid-cooling tank body and flows back to the second liquid storage tank, and/or passes through the $n^{th}$ liquid-cooling tank body to the $m^{th}$ liquid-cooling tank body successively and flows back to the second liquid storage tank.

In some embodiments, the system also includes:
  a processor connected with the heat exchanger and the vacuum generator and configured to control on/off of the heat exchanger and the vacuum generator.

In some embodiments, the system also includes: a flowmeter, configured to detect a flow rate of the cooling liquid flowing through the flowmeter. The heat exchanger is connected with the second liquid-cooling tank body by means of the flowmeter.

In some embodiments, the first liquid-cooling tank body also includes a first pressure sensor and a second pressure sensor.

The first pressure sensor is configured to detect the pressure in the first liquid-cooling tank body, and the second pressure sensor is configured to detect the pressure in the first liquid storage tank.

In some embodiments, the first liquid-cooling tank body also includes a first liquid level indicator and a second liquid level indicator.

The first liquid level indicator is configured to detect a liquid level in the first liquid-cooling tank body, and the second liquid level indicator is configured to detect a liquid level in the first liquid storage tank.

In some embodiments, the first liquid-cooling tank body also includes a first temperature sensor and a second temperature sensor.

The first temperature sensor is configured to detect a temperature in the first liquid-cooling tank body, and the second temperature sensor is configured to detect a temperature in the first liquid storage tank.

The present application also provides a liquid-cooling heat dissipation control method for servers, which is applied to the above liquid-cooling heat dissipation system for servers, and includes:
  acquiring a heat dissipation starting instruction;
  and controlling the vacuum generator and the heat exchanger in the liquid-cooling heat dissipation system to start according to the heat dissipation starting instruction so as to control the vacuum generator in the liquid-cooling heat dissipation system to start, whereby the cooling liquid in the first liquid storage tank in the liquid-cooling heat dissipation system passes through the first liquid-cooling tank body to the $n^{th}$ liquid-cooling tank body successively and flows back to the first liquid storage tank, and/or passes through the $n^{th}$ liquid-cooling tank body to the first liquid-cooling tank body successively and flows back to the first liquid storage tank.

In some embodiments, when the $m^{th}$ liquid-cooling tank body in the liquid-cooling heat dissipation system includes a second liquid storage tank, the controlling the vacuum generator in the liquid-cooling heat dissipation system to start according to the heat dissipation starting instruction includes:
  controlling corresponding valves in the liquid-cooling heat dissipation system to be opened according to a starting mode in the heat dissipation starting instruction, and controlling the vacuum generator and the heat exchanger in the liquid-cooling heat dissipation system to start.

In some embodiments, m=n=2, and the controlling corresponding valves in the liquid-cooling heat dissipation system to be opened according to a starting mode in the heat dissipation starting instruction, and controlling the vacuum generator and the heat exchanger in the liquid-cooling heat dissipation system to start includes:
  in a case where the starting mode in the heat dissipation starting instruction is a normal mode, controlling a first valve set in the liquid-cooling heat dissipation system to be opened, and controlling the vacuum generator and the heat exchanger in the liquid-cooling heat dissipation system and the first circulating pump in the first liquid storage tank to start, wherein the first valve set includes the first valve, the second valve, the sixth valve, the seventh valve, the eighth valve, the ninth valve, the tenth valve, and the eleventh valve; and
  in a case where the starting mode in the heat dissipation starting instruction is a spraying priority mode, controlling a second valve set in the liquid-cooling heat dissipation system to be opened, and controlling the vacuum generator and the heat exchanger in the liquid-cooling heat dissipation system and the second circulating pump in the second liquid storage tank to start, wherein the second valve set includes the third valve, the fourth valve, the fifth valve, the seventh valve, the eighth valve, the ninth valve, the tenth valve, and the twelfth valve.

The present application also provides a server liquid-cooling heat dissipation control apparatus, which is applied to the above liquid-cooling heat dissipation system for servers, and includes:
  an acquisition module, configured to acquire a heat dissipation starting instruction; and
  a control module, configured to control the vacuum generator and the heat exchanger in the liquid-cooling heat dissipation system to start according to the heat dissipation starting instruction so as to control the vacuum generator in the liquid-cooling heat dissipation system to start, whereby the cooling liquid in the first liquid storage tank in the liquid-cooling heat dissipation system passes through the first liquid-cooling tank body to the $n^{th}$ liquid-cooling tank body successively and flows back to the first liquid storage tank, and/or passes through the $n^{th}$ liquid-cooling tank body to the first liquid-cooling tank body successively and flows back to the first liquid storage tank.

The present application also provides a liquid-cooling heat dissipation control device for servers, including:
  a memory, configured to store computer programs; and
  a processor, configured to implement the steps of the above liquid-cooling heat dissipation control method for servers when executing the computer programs.

Furthermore, the present application further provides a non-volatile readable storage medium. The non-volatile readable storage medium stores computer programs, and the computer programs, when executed by a processor, implement the steps of the above liquid-cooling heat dissipation control method for servers.

The liquid-cooling heat dissipation system for servers provided by the present application includes: a heat exchanger, a vacuum generator, and n liquid-cooling tank bodies. n is a positive integer greater than or equal to 2, a liquid-cooling heat dissipation mode of at least one liquid-cooling tank body is spraying heat dissipation, and at least two liquid-cooling tank bodies have different liquid-cooling heat dissipation modes. The first liquid-cooling tank body includes a first liquid storage tank configured to store cooling liquid, the $i^{th}$ liquid-cooling tank body is connected with the $(i+1)^{th}$ liquid-cooling tank body by means of the heat exchanger, and the $n^{th}$ liquid-cooling tank body is connected with the first liquid storage tank body. The heat exchanger is configured to cool the cooling liquid flowing through the heat exchanger. A vacuum port of the vacuum generator is connected with the n liquid-cooling tank bodies and the first liquid storage tank, respectively, and configured to control and regulate a vacuum degree of the liquid-cooling tank bodies and the first liquid storage tank, whereby the cooling liquid in the first liquid storage tank passes through the first liquid-cooling tank body to the $n^{th}$ liquid-cooling tank body successively and flows back to the first liquid storage tank, and/or passes through the $n^{th}$ liquid-cooling tank body to the first liquid-cooling tank body successively and flows back to the first liquid storage tank. Each liquid-cooling tank body is configured to cool a server in the respective tank by using the cooling liquid flowing out of the heat exchanger or the first liquid storage tank. i is a positive integer less than or equal to n−1.

It can be seen that by arranging the vacuum generator of the present application, the negative pressure and cooling liquid circulation in the spraying liquid-cooling heat dissipation system are realized, the risk of cooling liquid leakage of the spraying liquid-cooling heat dissipation system is avoided thoroughly, and the resulting heat dissipation failure and potential risk of fire are eradicated at the same time, thereby improving the safety of the liquid-cooling heat dissipation system, and facilitating the large-scale commercial application of the liquid-cooling heat dissipation system. Moreover, by arranging the n liquid-cooling tank bodies of the present application, spraying heat dissipation is combined with other liquid-cooling heat dissipation, whereby the reasonable stepped heat dissipation can be realized according to the heat source characteristics of server components. Furthermore, the present application also provides a liquid-cooling heat dissipation control method for servers, control apparatus, and control device, and a non-volatile readable storage medium, which also have the above beneficial effects.

BRIEF DESCRIPTION OF THE DRAWINGS

In order to describe the technical solution in the embodiments of the present application or in the existing art more clearly, drawings required to be used in the descriptions of the embodiments or the existing art will be briefly introduced below. Apparently, the drawings described below are only some embodiments of the present application. Those of ordinary skill in the art can also obtain other drawings according to the provided drawings without contributing creative work.

DETAILED DESCRIPTION

To make the purposes, technical solutions, and advantages of embodiments of the present application clearer, the technical solutions in the embodiments of the present application are described clearly and completely in conjunction with accompanying drawings in the embodiments of the present application. Apparently, the described embodiments are some embodiments of the present application, not all embodiments. All other embodiments obtained by a person of ordinary skill in the art based on the embodiments of the present application without creative efforts shall fall within the protection scope of the present application.

Figure 1:
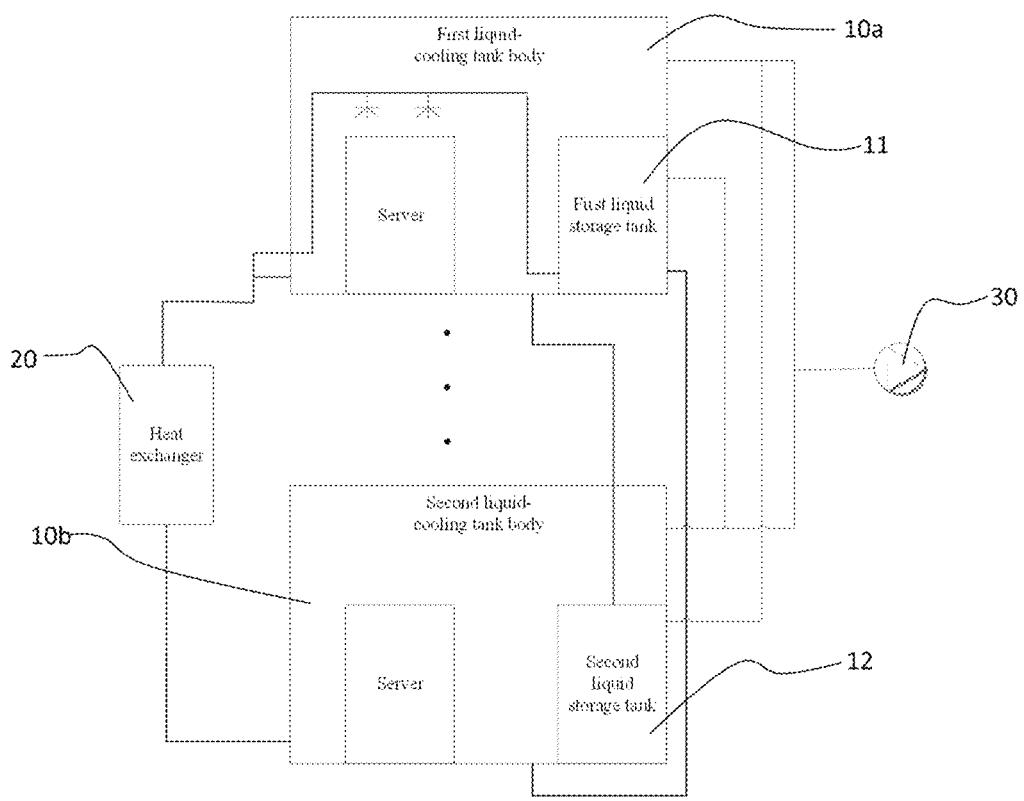
FIG. 1 is a schematic structural diagram of a liquid-cooling heat dissipation system for servers provided by an embodiment of the present application.

Referring to FIG. 1, FIG. 1 is a schematic structural diagram of a liquid-cooling heat dissipation system for servers provided by an embodiment of the present application. The system may include: a heat exchanger 20, a vacuum generator 30, and a number of n liquid-cooling tank bodies 10, including a first liquid-cooling tank body 10a and a second liquid-cooling tank body 10b. Where n is a positive integer greater than or equal to 2, a liquid-cooling heat dissipation mode of at least one liquid-cooling tank body 10 is spraying heat dissipation, and at least two liquid-cooling tank bodies 10 have different liquid-cooling heat dissipation modes.

The first liquid-cooling tank body 10a includes a first liquid storage tank 11 configured to store cooling liquid, the $i^{th}$ liquid-cooling tank body 10 is connected with the $(i+1)^{th}$ liquid-cooling tank body 10 by means of the heat exchanger 20, and the $n^{th}$ liquid-cooling tank body 10 is connected with the first liquid storage tank 11. The heat exchanger 20 is configured to cool the cooling liquid flowing through the heat exchanger. A vacuum port of the vacuum generator 30 is connected with the n liquid-cooling tank bodies 10 and the first liquid storage tank 11, respectively, and configured to control and regulate a vacuum degree of the liquid-cooling tank bodies 10 and the first liquid storage tank 11, whereby the cooling liquid in the first liquid storage tank 11 passes through the first liquid-cooling tank body 10 to the $n^{th}$ liquid-cooling tank body 10 successively and flows back to the first liquid storage tank 11, and/or passes through the $n^{th}$ liquid-cooling tank body 10 to the first liquid-cooling tank body 10 successively and flows back to the first liquid storage tank 11. Each liquid-cooling tank body 10 is configured to cool a server in the respective tank by using the cooling liquid flowing out of the heat exchanger 20 or the first liquid storage tank 11. Where i is a positive integer less than or equal to n−1.

It can be understood that by arranging the vacuum generator 30 in the present embodiment, the vacuum generator 30 can regulate the vacuum degree of the n liquid-cooling tank bodies 10 and the first liquid storage tank 11 when starting, whereby the cooling liquid in the first liquid storage tank 11 passes through the first liquid-cooling tank body 10a to the $n^{th}$ liquid-cooling tank body 10 successively and flows back to the first liquid storage tank 11, and/or passes through the $n^{th}$ liquid-cooling tank body 10 to the first liquid-cooling tank body 10a successively and flows back to the first liquid storage tank 11, thereby realizing the circulation of the cooling liquid in the system. Moreover, the n liquid-cooling tank bodies 10 include a tank body adopting spraying heat dissipation (such as a spraying tank body in FIG. 2), whereby the negative pressure and cooling liquid circulation in the spraying liquid-cooling heat dissipation system are realized, and the risk of cooling liquid leakage of the spraying liquid-cooling heat dissipation system is avoided thoroughly. Furthermore, at least two liquid-cooling tank bodies 10 of the n liquid-cooling tank bodies 10 are different in liquid-cooling heat dissipation modes, which realizes the combination of spraying heat dissipation and other liquid-cooling heat dissipation, whereby the reasonable stepped heat dissipation can be realized according to the heat source characteristics of server components.

Specifically, in the present embodiment, a specific method for using the vacuum generator 30 to regulate the vacuum degree of the n liquid-cooling tank bodies 10 and the first liquid storage tank 11 so as to realize the circulation of the cooling liquid in the system may be set by designers according to practical scenarios and user requirements. For example, the circulation of the cooling liquid may be realized by controlling the vacuum generator 30 and corresponding valves in the liquid-cooling heat dissipation system. For example, when n=2, a valve between the first liquid-cooling tank body 10a and the first liquid storage tank 11 is controlled to be opened first, a valve between the second liquid-cooling tank body 10b and the first liquid storage tank 11 is closed, the vacuum generator 30 controls a vacuum degree in the second liquid-cooling tank body 10b to be higher than a vacuum degree in the first liquid-cooling tank body 10a and higher than a vacuum degree in the first liquid storage tank 11, whereby the cooling liquid in the first liquid storage tank 11 can flow to the first liquid-cooling tank body 10a and the second liquid-cooling tank body 10b to cool servers in the first liquid-cooling tank body 10a and the second liquid-cooling tank body 10b. The valve between the first liquid-cooling tank body 10a and the first liquid storage tank 11 is controlled to be closed, the valve between the second liquid-cooling tank body 10b and the first liquid storage tank 11 is opened, and the vacuum generator 30 controls the vacuum degree in the first liquid-cooling tank body 10 to be lower than the vacuum degree in the second liquid-cooling tank body 10 and lower than the vacuum degree in the first liquid storage tank 11, whereby the cooling liquid flowing into the second liquid-cooling tank body 10b via the heat exchanger 20 can flow back to the first liquid storage tank body 11 to realize the circulation of the cooling liquid in the system.

Correspondingly, in the present embodiment, the circulation of the cooling liquid may also be realized by controlling the vacuum generator 30 and a circulating pump in the liquid-cooling heat dissipation system. For example, n=2, a circulating pump in the first liquid storage tank 11 is controlled to start, and the vacuum generator 30 controls a vacuum degree in the first liquid-cooling tank body 10a to be lower than a vacuum degree in the second liquid-cooling tank body 10b and lower than a vacuum degree in the first liquid storage tank 11, whereby the cooling liquid flows into the first liquid-cooling tank body 10a from the first liquid storage tank 11 by means of the circulating pump, and the cooling liquid flows out of the first liquid-cooling tank body 10a, flows to the second liquid-cooling tank body 10b via the heat exchanger 20, and flows back to the first liquid storage tank 11 by means of the vacuum generator 30. In the present embodiment, as long as the vacuum generator 30 can regulate the vacuum degree in the liquid-cooling tank bodies 10 and the first liquid storage tank 11 to realize the circulation of the cooling liquid in the system, the present embodiment does not impose any limitation on this.

It should be noted that the heat exchanger 20 in the present embodiment can cool the cooling liquid flowing through the heat exchanger to lower the temperature of the cooling liquid. In the present embodiment, the specific number of the heat exchanger 20 is not limited. For example, the number of the heat exchanger 20 may be 1 or a numerical value greater than 1, as long as the heat exchanger 20 can cool the cooling liquid flowing between the $i^{th}$ liquid-cooling tank body 10 and the $(i+1)^{th}$ liquid-cooling tank body 10. The present embodiment does not impose any limitation on this.

Figure 2:
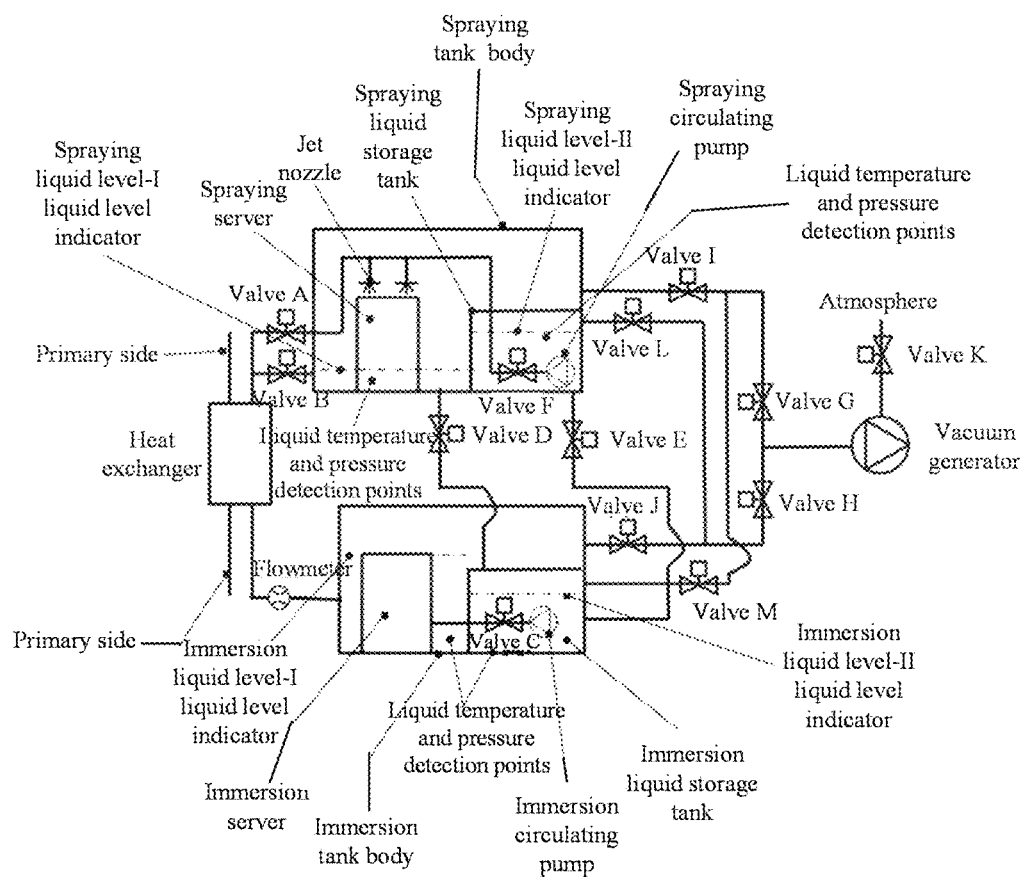
FIG. 2 is a schematic structural diagram of another liquid-cooling heat dissipation system for servers provided by an embodiment of the present application.

Specifically, the liquid-cooling tank body 10 in the present embodiment may be a tank using the cooling liquid to perform liquid-cooling heat dissipation on a server in the tank. The specific liquid-cooling heat dissipation modes of the n liquid-cooling tank bodies 10 in the present embodiment can be set by designers according to practical scenarios and user requirements. For example, the n liquid-cooling tank bodies 10 may include a spraying tank body adopting spraying heat dissipation, and may also include an immersion tank body adopting immersion heat dissipation, and may also include other tank bodies adopting other liquid-cooling heat dissipation modes. As shown in FIG. 2, when n is equal to 2, the first liquid-cooling tank body 10 may be specifically a spraying heat dissipation tank, and the second liquid-cooling tank body 10 may be specifically an immersion heat dissipation tank. As long as all the n liquid-cooling tank bodies 10 can use the cooling liquid to perform liquid-cooling heat dissipation on the servers in the tank bodies, the liquid-cooling heat dissipation mode of at least one liquid-cooling tank body 10 is spraying heat dissipation, and at least two liquid-cooling tank bodies 10 are different in liquid-cooling heat dissipation modes, the present embodiment does not impose any limitation on this.

Further, as shown in FIG. 1, the $m^{th}$ liquid-cooling tank body 10 in the present embodiment may also include a second liquid storage tank 12 configured to store the cooling liquid to switch the circulation of the cooling liquid in the system by using the second liquid storage tank 12, whereby the circulation of the cooling liquid in the first liquid storage tank 11 or the circulation of the cooling liquid in the second liquid storage tank 12 in the system can be realized according to the requirements. Where m is a positive integer greater than 1 and less than or equal to n, the first liquid storage tank 11 is connected with the first liquid-cooling tank body 10 by means of a first valve, the $n^{th}$ liquid-cooling tank body 10 is connected with the first liquid storage tank 11 by means of a second valve, the second liquid storage tank 12 is connected to the $m^{th}$ liquid-cooling tank body 10 by means of a third valve, and the second liquid storage tank 12 is connected with the first liquid-cooling tank body 10a by means of a fourth valve. Correspondingly, the vacuum port of the vacuum generator 30 is connected with the second liquid storage tank 12 and configured to control and regulate a vacuum degree of the second liquid storage tank 12 and the first liquid-cooling tank body 10a to the $m^{th}$ liquid-cooling tank body 10 when the first valve and the second valve are closed and the third valve and the fourth valve are opened, whereby the cooling liquid in the second liquid storage tank 12 passes through the first liquid-cooling tank body 10a to the $m^{th}$ liquid cooling tank body 10 and flows back to the second liquid storage tank 12, and/or passes through the $m^{th}$ liquid-cooling tank body 10 to the first liquid-cooling tank body 10a successively and flows back to the second liquid storage tank 12. Correspondingly, when n is greater than 2, the $q^{th}$ liquid-cooling tank body 10 may also include a third liquid storage tank configured to store the cooling liquid to switch the circulation of the cooling liquid in the system by using the third liquid storage tank. Where q is a positive integer greater than 1 and less than or equal to n, and q/n.

Correspondingly, the $m^{th}$ liquid-cooling tank body 10 may specifically be the $n^{th}$ liquid-cooling tank body 10, that is, m=n. The vacuum generator 30 can control and regulate the vacuum degree of the first liquid storage tank 11 and the first liquid-cooling tank body 10 to the $n^{th}$ liquid-cooling tank body 10 when the first valve and the second valve are opened and the third valve and the fourth valve are closed, whereby the cooling liquid in the first liquid storage tank 11 passes through the first liquid-cooling tank body 10a to the $n^{th}$ liquid-cooling tank body 10 and flows back to the first liquid storage tank 11, and/or passes through the $n^{th}$ liquid-cooling tank body 10 to the first liquid-cooling tank body 10a successively and flows back to the first liquid storage tank 11; and control and regulate the vacuum degree of the second liquid storage tank 12 and the first liquid-cooling tank body 10a to the $n^{th}$ liquid-cooling tank body 10 when the first valve and the second valve are closed and the third valve and the fourth valve are opened, whereby the cooling liquid in the second liquid storage tank 12 passes through the first liquid-cooling tank body 10a to the $n^{th}$ liquid-cooling tank body 10 and flows back to the second liquid storage tank 12, and/or passes through the $n^{th}$ liquid-cooling tank body 10 to the first liquid-cooling tank body 10a successively and flows back to the second liquid storage tank 12.

As shown in FIG. 2, when m=n=2, the first liquid storage tank 11 (a spraying liquid storage tank) is connected with the first liquid-cooling tank body 10a (the spraying tank) by means of the first valve (valve F), the second liquid-cooling tank body 10 (the immersion tank) is connected with the first liquid storage tank 11 by means of the second valve (valve E), the second liquid storage tank 12 (an immersion liquid storage tank) is connected to the second liquid-cooling tank body 10b by means of the third valve (valve C), and the second liquid storage tank 12 is connected with the first liquid-cooling tank body 10a by means of the fourth valve (valve D). Correspondingly, the vacuum port of the vacuum generator 30 is connected with the second liquid storage tank 12 and can control and regulate the vacuum degree of the second liquid-cooling tank body 10b, the second liquid storage tank 12, and the first liquid cooling tank body 10a when the first valve and the second valve are closed and the third valve and the fourth valve are opened, whereby the cooling liquid in the second liquid storage tank 12 passes through the first liquid-cooling tank body 10a, the heat exchanger 20, and the second liquid-cooling tank body 10b successively and flows back to the second liquid storage tank 12, and/or passes through the second liquid-cooling tank body 10b, the heat exchanger 20, and the first liquid-cooling tank body 10a successively and flows back to the second liquid storage tank 12 so as to realize the circulation of the cooling liquid in the second liquid storage tank 12; and control and regulate the vacuum degree of the second liquid-cooling tank body 10b, the first liquid storage tank 11, and the first liquid-cooling tank body 10a when the first valve and the second valve are opened and the third valve and the fourth valve are closed, whereby the cooling liquid in the first liquid storage tank 11 passes through the first liquid-cooling tank body 10a, the heat exchanger 20, and the second liquid-cooling tank body 10b successively and flows back to the first liquid storage tank 11, and/or passes through the second liquid cooling tank body 10b, the heat exchanger 20, and the first liquid-cooling tank body 10a successively and flows back to the first liquid storage tank 11 so as to realize the circulation of the cooling liquid in the first liquid storage tank 11.

Further, when m is not equal to n, the second liquid storage tank 12 can be connected with the $n^{th}$ liquid-cooling tank body 10 by means of a thirteenth valve to realize the circulation of the cooling liquid in the second liquid storage tank 12 between the $m^{th}$ liquid-cooling tank body 10 and the $n^{th}$ liquid-cooling tank body 10 according to the requirements. The vacuum generator 30 can also control and regulate the vacuum degree of the second liquid storage tank 12 and the $m^{th}$ liquid-cooling tank body 10 to the $n^{th}$ liquid-cooling tank body 10 when the first valve, the second valve, and the fourth valve are closed and the third valve and the fifth valve are opened, whereby the cooling liquid in the second liquid storage tank 12 passes through the $m^{th}$ liquid-cooling tank body 10 to the $n^{th}$ liquid-cooling tank body 10 and flows back to the second liquid storage tank 12, and/or passes through the $n^{th}$ liquid-cooling tank body 10 to the $m^{th}$ liquid-cooling tank body 10 successively and flows back to the second liquid storage tank 12.

It should be noted that the liquid storage tank (such as the first liquid storage tank 11 and the second liquid storage tank 12) in the liquid-cooling tank body 10 can be provided with a circulating pump to use the circulating pump to take part in the circulation of the cooling liquid. For example, the first liquid storage tank 11 in the present embodiment may include: a first circulating pump configured to pump the cooling liquid in the first liquid storage tank 11 into the first liquid-cooling tank body 10a. An outlet of the first circulating pump is connected to the first liquid-cooling tank body 10a by means of the first valve. The second liquid storage tank 12 in the present embodiment may include: a second circulating pump configured to pump the cooling liquid in the second liquid storage tank 12 into the second liquid-cooling tank body 10b. An outlet of the second circulating pump is connected to the second liquid-cooling tank body 10b by means of the third valve. As shown in FIG. 2, the first circulating pump (a spraying circulating pump) in the first liquid storage tank 11 (the spraying liquid storage tank) pumps the cooling liquid to the first liquid-cooling tank body 10a by means of the opened first valve (valve F), whereby a jet nozzle of the first liquid-cooling tank body 10a (the spraying tank body) can use the cooling liquid in the first liquid storage tank 11 to perform spraying heat dissipation on the server (a spraying server); and a second circulating pump (an immersion circulating pump) in the second liquid storage tank 12 (the immersion liquid storage tank) pumps the cooling liquid to the second liquid-cooling tank body 10b (the immersion tank body) by means of the opened second valve (valve C) so as to perform immersion heat dissipation on the server (an immersion server).

Correspondingly, the specific structures of the n liquid-cooling tank bodies 10 and the specific connection modes between the liquid-cooling tank bodies and the heat exchanger 20 in the present embodiment can be set by designers according to practical scenarios and user requirements. For example, the spraying tank body of the n liquid-cooling tank bodies 10 may use the jet nozzle to perform spraying heat dissipation on the server in the tank. As shown in FIG. 2, when the first liquid-cooling tank body 10 is specifically a spraying tank, the first liquid-cooling tank body 10a includes: a jet nozzle configured to spray the server in the tank body by using the cooling liquid flowing out of a first liquid-cooling exchange port of the first liquid-cooling tank body 10a or the first liquid storage tank 11 to cool the server in the tank body. The first liquid storage tank 11 is connected to the jet nozzle by means of the first valve, the first liquid-cooling exchange port of the first liquid-cooling tank body 10a is connected to the jet nozzle, the first liquid-cooling exchange port of the first liquid-cooling tank body 10 is connected to a first input/output port of the heat exchanger 20 by means of a fifth valve (valve A), a second liquid-cooling exchange port of the first liquid-cooling tank body 10 is connected to the first input/output port by means of a sixth valve (valve B), and a second input/output port of the heat exchanger 20 is connected with the second liquid-cooling tank body 10. Correspondingly, when n=2 and the second liquid-cooling tank body 10b is specifically an immersion tank body, a first liquid-cooling exchange port of the second liquid-cooling tank body 10b is connected with the second input/output port of the heat exchanger 20, a second liquid-cooling exchange port of the second liquid-cooling tank body 10b is connected with the first liquid storage tank 11, and the second liquid storage tank 12 is connected with a third liquid-cooling exchange port of the first liquid-cooling tank body 10a. As shown in FIG. 2, the second input/output port of the heat exchanger 20 can be connected directly with the first liquid-cooling exchange port of the second liquid-cooling tank body 10b, the second liquid-cooling exchange port of the second liquid-cooling tank body 10b can be connected with the first liquid storage tank 11 by means of the second valve (valve E), and the second liquid storage tank 12 is connected with the third liquid-cooling exchange port of the first liquid-cooling tank body 10a by means of the third valve (valve C).

Similarly, the specific connection relationship between the vacuum generator 30 and the liquid-cooling tank body 10 in the present embodiment, namely, the connection relationship of vacuum pipes, can be set by designer according to practical scenario and user requirement. For example, the number of the vacuum generator 30 may be 1 or a value greater than 1. As shown in FIG. 2, when the number of the vacuum generator 30 is 1, the vacuum port of the vacuum generator 30 can be connected with the first liquid-cooling tank body 10a successively by means of a seventh valve (valve G) and an eighth valve (valve I), the vacuum port of the vacuum generator 30 is connected with the second liquid-cooling tank body 10b successively by means of a ninth valve (valve H) and a tenth valve (valve J), the vacuum port of the vacuum generator 30 is connected with the first liquid storage tank 11 successively by means of the ninth valve and an eleventh valve (valve L), and the vacuum port of the vacuum generator 30 is connected with the second liquid storage tank 12 successively by means of the seventh valve and a twelfth valve (valve M).

Correspondingly, as shown in FIG. 2, an air inlet of the vacuum generator 30 can be connected to an external environment by means of a fourteenth valve (valve K), whereby when the vacuum generator 30 can suck the air by means of the opened fourteenth valve and discharge the air from an air exhaust when starting, thereby forming a corresponding vacuum degree at the vacuum port.

It should be noted that the liquid-cooling heat dissipation system provided by the present embodiment may also include a flowmeter configured to detect a flow rate of the cooling liquid flowing through the flowmeter, whereby the flow rate of the circulating cooling liquid is detected by using the flowmeter. The heat exchanger 20 can be connected with the second liquid-cooling tank body 10b or the first liquid-cooling tank body 10a by means of the flowmeter. As shown in FIG. 2, the flowmeter may be arranged between the heat exchanger 20 and the second liquid-cooling tank body 10b to detect the flow rate of the cooling liquid circulating between the first liquid-cooling tank body 10a and the second liquid-cooling tank body 10b.

Correspondingly, the liquid-cooling heat dissipation system of the server provided by the present embodiment can also include a sensor group arranged in the liquid-cooling tank body 10, such as a pressure sensor, a temperature sensor, a liquid level indicator, etc. For example, the first liquid-cooling tank body 10a may also include a first pressure sensor and a second pressure sensor, wherein the first pressure sensor is configured to detect pressure in the first liquid-cooling tank body 10a, and the second pressure sensor is configured to detect the pressure in the first liquid storage tank body 11. The first liquid-cooling tank body 10a may also include a first liquid level indicator and a second liquid level indicator, wherein the first liquid level indicator is configured to detect a liquid level in the first liquid-cooling tank body 10a, and the second liquid level indicator is configured to detect a liquid level in the first liquid storage tank 11. The first liquid-cooling tank body 10a may also include a first temperature sensor and a second temperature sensor, wherein the first temperature sensor is configured to detect a temperature in the first liquid-cooling tank body 10a, and the second temperature sensor is configured to detect a temperature in the first liquid storage tank 11. As shown in FIG. 2, the sensor groups of both the first liquid-cooling tank body 10a and the second liquid-cooling tank body 10b may include the liquid level indicator (such as a spraying liquid level-I liquid level indicator, a spraying liquid level-II liquid level indicator, an immersion liquid level-I liquid level indicator or an immersion liquid level-II liquid level indicator), the temperature sensor (a liquid temperature detection sensor) and the pressure sensor (a pressure detection sensor) so as to detect the pressure, temperature and liquid level in the liquid-cooling tank bodies 10 and the liquid storage tank.

Correspondingly, the liquid-cooling heat dissipation system for servers provided by the present embodiment may also include a processor (such as a processor of a liquid-cooling heat dissipation control device) connected with the heat exchanger 20 and the vacuum generator 30, which is configured to control on/off of the heat exchanger 20 and the vacuum generator 30 so as to realize the circulation of the cooling liquid in the liquid-cooling heat dissipation system. Correspondingly, the processor can also be connected with the corresponding valves (such as the first valve to the fourteenth valve) in the liquid-cooling heat dissipation system so as to control the opening and closing of the valves. For example, as shown in FIG. 2, when the first liquid-cooling tank body 10a is specifically the spraying tank body, and the second liquid-cooling tank body 10b is specifically the immersion tank body, in a case where the servers in the first and second liquid-cooling tank bodies 10a, 10b are similar in configuration, the processor can control the valve sets C, A, D, I, J, M, G, H and K to be opened and other valve sets to be closed, control the vacuum generator 30 to start for forming vacuum, control the immersion circulating pump (i.e. the second circulating pump) and the heat exchanger 20 to start, and control the immersion server (i.e. the server in the second liquid-cooling tank body 10b) and the spraying server (i.e. the server in the first liquid-cooling tank body 10a) to be powered on after the pressure, temperature and liquid level in the spraying tank body, the immersion tank body and the immersion liquid storage tank (i.e. the second liquid storage tank 12) and the flow rate in the pipes meet a preset parameter interval; that is, when the spraying circulating pump is started, the cooling liquid flows into the jet nozzle from the spraying circulating pump to fall onto the spraying server, after absorbing the heat, the cooling liquid flows out of the valve B and flows into the heat exchanger 20 to be cooled, and then the cooling liquid flows into the immersion liquid-cooling tank body 10 to cool the immersion liquid-cooling server and then flows back to the spraying liquid storage tank, and the cooling liquid circulates in this way; and the spraying tank body, the immersion tank body and the spraying liquid storage tank can be in a low vacuum degree, a medium vacuum degree and a high vacuum degree respectively under the action of the vacuum generator 30, that is, the cooling liquid flows into the spraying tank body from the spraying liquid storage tank by means of the circulating pump, and the cooling liquid flows out of the spraying tank body and finally flows back to the spraying liquid storage tank by means of the vacuum generator 30, and in this way, the pressure at all parts of the system is lower than the atmospheric pressure, thereby avoiding the risk of leakage caused by the racking or loosening of some parts of the system.

In a case where the servers in the first and second liquid-cooling tank bodies 10a, 10b are different in configuration, for example, the server in the spraying tank body adopts a high-density CPU/GPU pooling layout solution, and the server in the immersion tank body adopts a CXL pooling solution with low heat flow density, the processor can control the valve sets C, A, D, I, J, M, G, H and K to be opened and other valve sets to be closed, control the vacuum generator 30 and the heat exchanger 20 to start, and control the immersion circulating pump to start, whereby the cooling liquid flows out of the immersion circulating pump and then flows into the immersion tank body to cool the immersion liquid-cooling server, and then after being cooled by the heat exchanger 20, the low-temperature cooling liquid is sprayed by the jet nozzle onto the spraying server to absorb the heat and finally flows back to the immersion liquid storage tank from the valve D. At this time, the immersion tank body, the spraying tank body and the immersion liquid storage tank can be in the low vacuum degree, the medium vacuum degree and the high vacuum degree respectively under the action of the vacuum generator 30; the cooling liquid flows into the immersion tank from the immersion liquid storage tank by means of the immersion circulating pump, and the cooling liquid flows out of the immersion tank body and finally flows back to the immersion liquid storage tank by means of the vacuum generator 30; in this way, the pressure at all parts of the whole system is lower than the atmospheric pressure, thereby avoiding the risk of leakage caused by the cracking or loosening of some parts of the system; and at the same time, after being cooled by the heat exchanger 20, the cooling liquid with low temperature first enters the spraying liquid-cooling tank body 10 with higher heat dissipation efficiency, whereby the heat dissipation efficiency of the spraying tank body is far higher than the immersion tank body in this case, which facilitates the stepped heat dissipation.

In the present embodiment, by arranging the vacuum generator 30, the negative pressure and the cooling liquid circulation in the spraying liquid-cooling heat dissipation system are realized, the risk of cooling liquid leakage in the spraying liquid-cooling heat dissipation system is avoided thoroughly, and the resulting heat dissipation failure and the potential fire risk are also eradicated, thereby improving the safety of the liquid-cooling heat dissipation system, and facilitating the large-scale commercial application of the liquid-cooling heat dissipation system; and moreover, by arranging n liquid-cooling tank bodies 10, spraying heat dissipation is combined with other liquid-cooling heat dissipation, whereby the reasonable stepped heat dissipation can be realized according to the heat source characteristics of the server components.

Corresponding to the above system embodiment, an embodiment of the present application also provides a liquid-cooling heat dissipation control method for servers, and the liquid-cooling heat dissipation control method for servers described below and the liquid-cooling heat dissipation system for servers described above can refer to each other.

Figure 3:
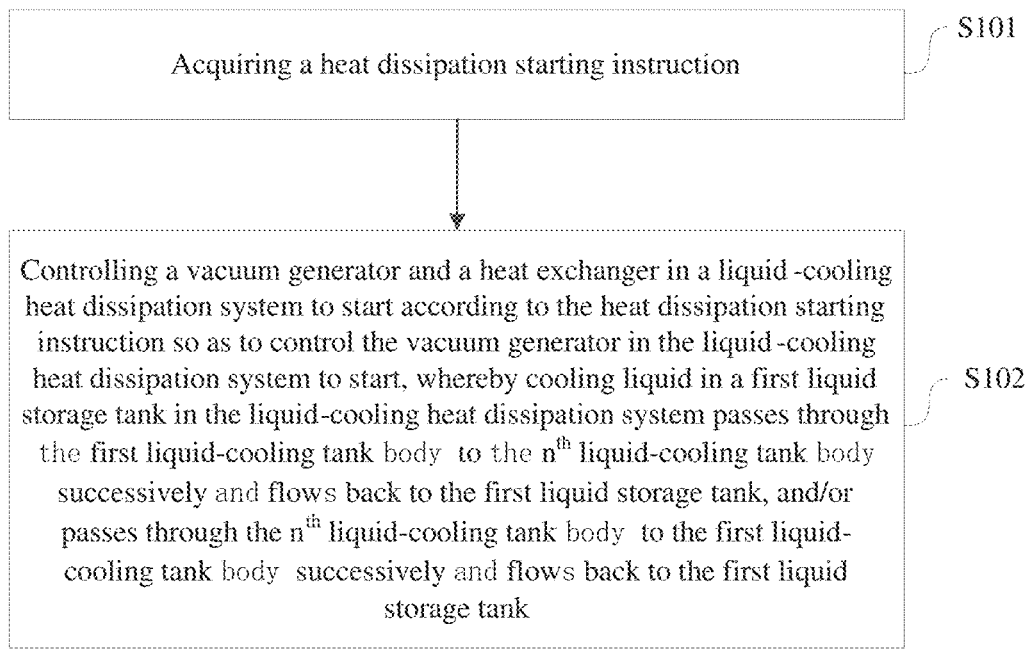
FIG. 3 is a flowchart of a liquid-cooling heat dissipation control method for servers provided by an embodiment of the present application.

Referring to FIG. 3, FIG. 3 is a flow chart of a liquid-cooling heat dissipation control method for servers provided by an embodiment of the present application. The method is applied to the liquid-cooling heat dissipation system for servers provided in the above embodiments, which can include:

Step 101: acquiring a heat dissipation starting instruction.

The heat dissipation starting instruction in the present embodiment can be an instruction controlling the liquid-cooling heat dissipation system to start for heat dissipation. That is, the processor in the liquid-cooling heat dissipation control device in the present embodiment can use the acquired heat dissipation starting instruction to control the liquid-cooling heat dissipation system to start the heat dissipation.

Specifically, the specific method for the processor to acquire the heat dissipation starting instruction in the present step can be set by the designers according to the practical scenarios and the user requirements, for example, the processor can receive or generate the heat dissipation starting instruction directly, for example, the user can perform an operation by means of an interaction interface or an interaction key of the liquid-cooling heat dissipation control device to control the processor to generate the heat dissipation starting instruction. The processor can also generate the heat dissipation starting instruction according to the configuration information of the server in each liquid-cooling tank body in the liquid-cooling heat dissipation system, for example, the processor can generate the heat dissipation starting instruction according to the configuration information of the server after receiving a server starting instruction.

The heat dissipation starting instruction can include a starting mode corresponding to the configuration information of the server. The present embodiment does not impose any limitation on this.

Step 102: controlling the vacuum generator and the heat exchanger of the liquid-cooling heat dissipation system to start according to the heat dissipation starting instruction so as to control the vacuum generator in the liquid-cooling heat dissipation system to start, whereby the cooling liquid in the first liquid storage tank in the liquid-cooling heat dissipation system passes through the first liquid-cooling tank body to the $n^{th}$ liquid-cooling tank body successively and flows back to the first liquid storage tank, and/or passes through the $n^{th}$ liquid-cooling tank body to the first liquid-cooling tank body successively and flows back to the first liquid storage tank.

It can be understood that the processor in the present step can control the vacuum generator and the heat exchanger in the liquid-cooling heat dissipation system to start according to the acquired heat dissipation starting instruction, whereby the cooling liquid in the liquid-cooling heat dissipation system circulates for performing heat dissipation on the server in the liquid-cooling heat dissipation system.

Specifically, the specific method for the processor to control the vacuum generator in the liquid-cooling heat dissipation system to start according to the heat dissipation starting instruction in the present step can be set by the designers according to the practical scenarios and the user requirements for example, the processor can control the vacuum generator directly to start so as to regulate the vacuum degree in the n liquid-cooling tank bodies and the vacuum degree in the first liquid storage tank, thereby realizing the circulation of the cooling liquid among the first liquid storage tank, the n liquid-cooling tank bodies and the heat exchanger.

Correspondingly, the processor can also control the corresponding valves in the liquid-cooling heat dissipation system to be opened first, and then control the vacuum generator and the heat exchanger in the liquid-cooling heat dissipation system to start; for example, when the $m^{th}$ liquid-cooling tank body in the liquid-cooling heat dissipation system includes the second liquid storage tank, the processor can control the corresponding valves in the liquid-cooling heat dissipation system to be opened according to the starting mode in the heat dissipation starting instruction and control the vacuum generator and the heat exchanger in the liquid-cooling heat dissipation system to start. In a case where the liquid-cooling heat dissipation system adopts the structure as shown in FIG. 2, that is, m is equal to n and equal to 2, and the second liquid-cooling tank body 10b includes a second liquid storage tank, and in a case where the starting mode in the heat dissipation starting instruction is a normal mode, the processor can control the first valve set in the liquid-cooling heat dissipation system to be opened, and control the vacuum generator and the heat exchanger in the liquid-cooling heat dissipation system and the first circulating pump (the spraying circulating pump) in the first liquid storage tank (the spraying liquid storage tank) to start; wherein the first valve set includes the first valve (valve F), the second valve (valve E), the sixth valve (valve B), the seventh valve (valve G), the eighth valve (valve I), the ninth valve (valve H), the tenth valve (valve J) and the eleventh valve (valve L), and the first valve set can also include the twelfth valve (valve K); and in a case where the starting mode in the heat dissipation starting instruction is a spraying priority mode, the processor can control the second valve set in the liquid-cooling heat dissipation system to be opened, and control the vacuum generator and the heat exchanger in the liquid-cooling heat dissipation system and the second circulating pump (the immersion circulation pump) in the second liquid storage tank (the immersion liquid storage tank) to start, wherein the second valve set includes the third valve (valve C), the fourth valve (valve D), the fifth valve (valve A), the seventh valve (valve G), the eighth valve (valve I), the ninth valve (valve H), the tenth valve (valve J) and the twelfth valve (valve M), and the first valve set can also include the twelfth valve (valve K).

Further, the processor in the present embodiment can also regulate working parameters of the vacuum generator according to the acquired sensor data after the vacuum generator is started. As shown in FIG. 2, the processor can regulate the working parameters of the vacuum generator and the circulating pump corresponding to the starting mode according to sensor data corresponding to the starting mode so as to regulate the parameters such as pressure, temperature, liquid level, flow rate in the pipes, etc. in the liquid-cooling tank bodies and the liquid storage tank in which the cooling liquid circulates.

Correspondingly, the processor in the present embodiment can also control the server in the liquid-cooling heat dissipation system to start after the working parameters of the vacuum generator satisfy a preset condition. For example, the processor can generate the heat dissipation starting instruction according to the configuration information of the server after receiving the server starting instruction; control the corresponding valves in the liquid-cooling heat dissipation system to be opened according to the starting mode in the heat dissipation starting instruction, and control the vacuum generator and the heat exchanger in the liquid-cooling heat dissipation system to start; regulate the working parameters of the vacuum generator and the circulating pump corresponding to the starting mode according to the sensor data corresponding to the starting mode; and control the servers (the immersion server and the spraying server in FIG. 2) in the liquid-cooling heat dissipation system to start after each sensor data meets the corresponding preset parameter interval.

In the present embodiment, the vacuum generator in the liquid-cooling heat dissipation system is controlled to start according to the heat dissipation starting instruction, and the started vacuum generator can realize the circulation of the cooling liquid in the liquid-cooling heat dissipation system and realize the negative pressure in the liquid-cooling heat dissipation system, thereby thoroughly avoiding the risk of cooling liquid leakage of the spraying liquid-cooling heat dissipation system, and also eradicating the resulting heat dissipation failure and potential fire risk, thus improving the safety of the liquid-cooling heat dissipation system, and facilitating the large-scale commercial application of the liquid-cooling heat dissipation system; and moreover, by arranging n liquid-cooling tank bodies, spraying heat dissipation is combined with other liquid-cooling heat dissipation, whereby the reasonable stepped heat dissipation can be realized according to the heat source characteristics of the server components.

Corresponding to the above method embodiment, an embodiment of the present application also provides a server liquid-cooling heat dissipation control apparatus, and the server liquid-cooling heat dissipation control apparatus described below and the server liquid-cooling heat dissipation method described above can refer to each other.

Figure 4:
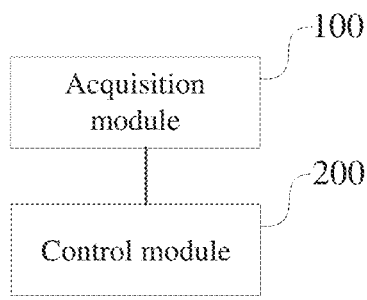
FIG. 4 is a structural block diagram of a server liquid-cooling heat dissipation control apparatus provided by an embodiment of the present application.

Referring to FIG. 4, FIG. 4 is a structural block diagram of a server liquid-cooling heat dissipation control apparatus provided by an embodiment of the present application. The apparatus is applied to the liquid-cooling heat dissipation system for servers provided in the above embodiments, and may include:

an acquisition module 100, configured to acquire a heat dissipation starting instruction; and a control module 200, configured to control the vacuum generator and the heat exchanger of the liquid-cooling heat dissipation system to start according to the heat dissipation starting instruction so as to control the vacuum generator in the liquid-cooling heat dissipation system to start, whereby the cooling liquid in the first liquid storage tank in the liquid-cooling heat dissipation system passes through the first liquid-cooling tank body to the $n^{th}$ liquid-cooling tank body successively and flows back to the first liquid storage tank, and/or passes through the $n^{th}$ liquid-cooling tank body to the first liquid-cooling tank body successively and flows back to the first liquid storage tank.

In some embodiments, when the $m^{th}$ liquid-cooling tank body in the liquid-cooling heat dissipation system includes the second liquid storage tank, the control module 200 may be specifically configured to control corresponding valves in the liquid-cooling heat dissipation system to be opened according to a starting mode in the heat dissipation starting instruction, and control the vacuum generator and the heat exchanger in the liquid-cooling heat dissipation system to start.

In some embodiments, m=n=2, and the control module 200 may include:

a normal heat dissipation control submodule, configured to control a first valve set in the liquid-cooling heat dissipation system to be opened, and control the vacuum generator and the heat exchanger in the liquid-cooling heat dissipation system and the first circulating pump in the first liquid storage tank to start when the starting mode in the heat dissipation starting instruction is a normal mode, wherein the first valve set includes a first valve, a second valve, a sixth valve, a seventh valve, an eighth valve, a ninth valve, a tenth valve, and an eleventh valve; and a stepped heat dissipation control submodule, configured to control a second valve set in the liquid-cooling heat dissipation system to be opened, and control the vacuum generator and the heat exchanger in the liquid-cooling heat dissipation system and the second circulating pump in the second liquid storage tank to start when the starting mode in the heat dissipation starting instruction is a spraying priority mode, wherein the second valve set includes a third valve, a fourth valve, a fifth valve, the seventh valve, the eighth valve, the ninth valve, the tenth valve, and the twelfth valve.

In the present embodiment, the control module 200 controls the vacuum generator in the liquid-cooling heat dissipation system to start according to the heat dissipation starting instruction, and the circulation of the cooling liquid in the liquid-cooling heat dissipation system and the negative pressure in the liquid-cooling heat dissipation system can be realized by using the started vacuum generator, thereby thoroughly avoiding the risk of cooling liquid leakage of the spraying liquid-cooling heat dissipation system, and also eradicating the resulting heat dissipation failure and potential fire risk, thus improving the safety of the liquid-cooling heat dissipation system, and facilitating the large-scale commercial application of the liquid-cooling heat dissipation system. Moreover, by arranging the n liquid-cooling tank bodies, spraying heat dissipation is combined with other liquid-cooling heat dissipation, whereby the reasonable stepped heat dissipation can be realized according to the heat source characteristics of server components.

Corresponding to the above method embodiment, an embodiment of the present application also provides a liquid-cooling heat dissipation control device for servers, and the liquid-cooling heat dissipation control device for servers described below and the server liquid-cooling heat dissipation method described above can refer to each other.

Figure 5:
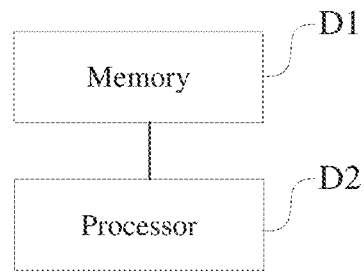
FIG. 5 is a schematic structural diagram of a liquid-cooling heat dissipation control device for servers provided by an embodiment of the present application.

Referring to FIG. 5, FIG. 5 is a schematic structural diagram of a liquid-cooling heat dissipation control device for servers provided by an embodiment of the present application. The liquid-cooling heat dissipation control device may include:
- a memory D1, configured to store computer programs; and
- a processor D2, configured to implement, when executing the computer programs, the steps of the liquid-cooling heat dissipation control method for servers provided in the above method embodiment.

Figure 6:
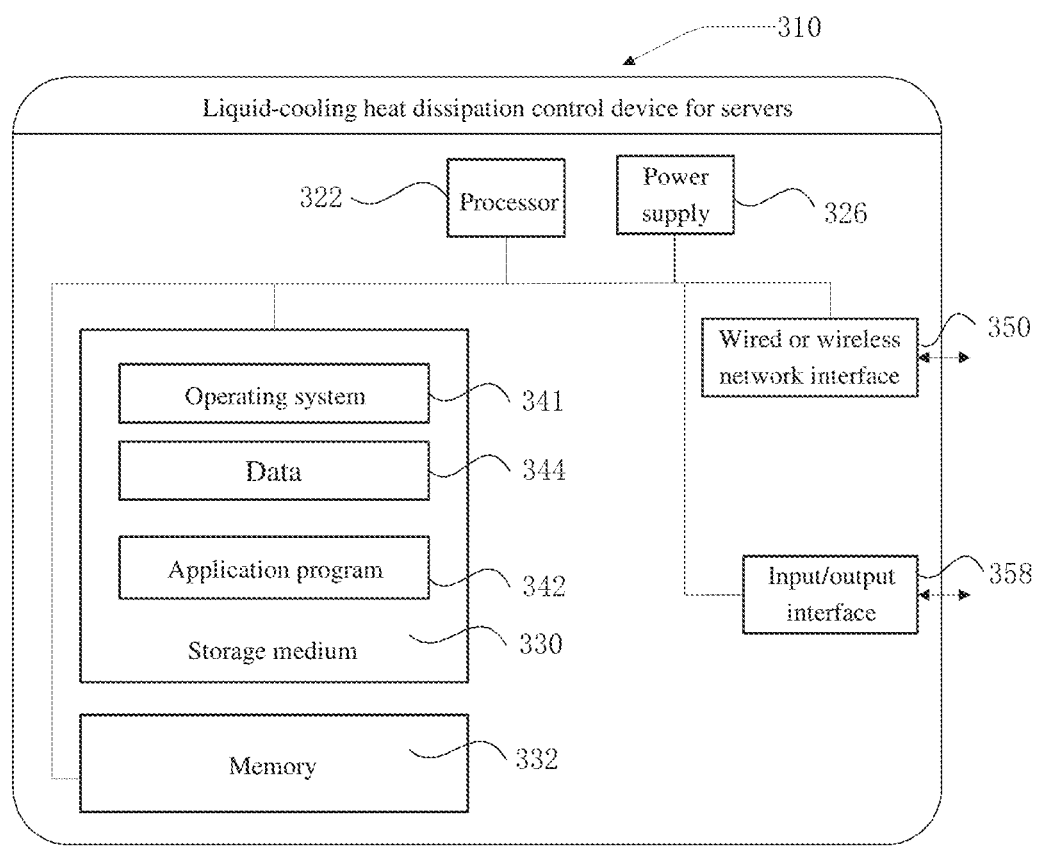
FIG. 6 is a schematic diagram of a specific structure of a liquid-cooling heat dissipation control device for servers provided by an embodiment of the present application.

Specifically, referring to FIG. 6, FIG. 6 is a schematic diagram of a specific structure of a liquid-cooling heat dissipation control device for servers provided by an embodiment of the present application, and the liquid-cooling heat dissipation control device 310 may be quite different due to different configuration or performance, and may include one or more processors (central processing units (CPU)) 322 (such as one or more processors) and a memory 332, and one or more storage media 330 (such as one or more vast storage devices) storing application programs 342 or data 344. The memory 332 and the storage medium 330 may be transient storage or persistent storage. The programs stored on the storage medium 330 may include one or more modules (not shown in the figure), and each module may include a series of instruction operations for a data processing device. Further, the central processor 322 may be set to communicate with the storage medium 330 and execute a series of instruction operations in the storage medium 330 on the liquid-cooling heat dissipation control device 310.

The liquid-cooling heat dissipation control device 310 may also include one or more power supplies 326, one or more wired or wireless network interfaces 350, one or more input/output interfaces 358, and/or one or more operating systems 341 such as Windows Server™, Mac OS X™, Unix™, Linux™, and FreeBSD™.

The liquid-cooling heat dissipation control device 310 may specifically be a server or a computer terminal.

The steps in the above-mentioned liquid-cooling heat dissipation control method for servers can be implemented by the liquid-cooling heat dissipation control device for servers.

Corresponding to the above method embodiment, an embodiment of the present application also provides a non-volatile readable storage medium. The non-volatile readable storage medium described below and the liquid-cooling heat dissipation control method for servers described above can refer to each other.

A non-volatile readable storage medium is provided. The non-volatile readable storage medium stores computer programs, and the computer programs, when executed by a processor, implement the steps of the liquid-cooling heat dissipation control method for servers provided in the above method embodiment.

The non-volatile readable storage medium can specifically be various readable storage media capable of storing program codes such as a USB flash drive, a portable hard disk, a Read-Only Memory (ROM), a Random-Access Memory (RAM), a magnetic disk or a compact disk, etc.

Each embodiment of the present specification is described in a progressive manner, each embodiment focuses on the difference from other embodiments, and the same and similar parts between the embodiments may refer to each other. The method, apparatus, device, and non-volatile readable storage medium disclosed in the embodiments are simple in description because they correspond to the system disclosed in the embodiments, and relevant information was referred to the description of the method.

The liquid-cooling heat dissipation system for servers, control method, control apparatus, and control device, and the non-volatile readable storage medium provided by the present application are described in detail above. The principle and embodiments of the present application are described herein with a specific example. The above embodiments are explained to help the understanding of the method and core concept of the present application. It should be pointed out that various improvements and modifications may be made by those skilled in the art without departing from the concept of the present application. These improvements and modifications should also fall within the protection scope of the present application.

What is claimed is:

1. A liquid-cooling heat dissipation system for servers, comprising: a heat exchanger, a vacuum generator, a first liquid-cooling tank body and a second liquid-cooling tank body for liquid cooling servers to be disposed therein respectively, wherein the liquid cooling server in the first liquid-cooling tank body is cooled in a spraying heat dissipation manner and the liquid cooling server in the second liquid-cooling tank body is cooled in an immersion heat dissipation manner;

wherein the first liquid-cooling tank body comprises a first liquid storage tank configured to store cooling liquid, the second liquid-cooling tank body comprises a second liquid storage tank configured to store the cooling liquid, the first liquid-cooling tank body is connected with the second liquid-cooling tank body by means of the heat exchanger, the first liquid storage tank is connected with the first liquid-cooling tank body by means of a first valve, the second liquid-cooling tank body is connected with the first liquid storage tank by means of a second valve, the second liquid storage tank is connected to the second liquid-cooling tank body by means of a third valve, the second liquid storage tank is connected with the first liquid-cooling tank body by means of a fourth valve, and the heat exchanger is configured to cool the cooling liquid flowing through the heat exchanger;

wherein a vacuum port of the vacuum generator is connected with the first liquid-cooling tank body and the second liquid-cooling tank body and the first liquid storage tank and second liquid storage tank, respectively, and the vacuum generator is configured to create and regulate:

vacuum degrees of the first liquid-cooling tank body, the second liquid-cooling tank body and the first liquid storage tank when the first valve and the second valve are opened and the third valve and the fourth valve are closed, whereby the cooling liquid circulates between the first liquid storage tank and the first liquid-cooling tank body and the second liquid-cooling tank body; and vacuum degrees of the second liquid storage tank, the first liquid-cooling tank body and second liquid-cooling tank body when the first valve and the second valve are closed and the third valve and the fourth valve are opened, whereby the cooling liquid circulates between the second liquid storage tank and the first liquid-cooling tank body and the second liquid-cooling tank body.

2. The liquid-cooling heat dissipation system according to claim 1, wherein the first liquid storage tank comprises: a first circulating pump, configured to pump the cooling liquid in the first liquid storage tank to the first liquid-cooling tank body, and an outlet of the first circulating pump is connected to the first liquid-cooling tank body by means of the first valve; and the second liquid storage tank comprises: a second circulating pump, configured to pump the cooling liquid in the second liquid storage tank to the second liquid-cooling tank body, and an outlet of the second circulating pump is connected to the second liquid-cooling tank body by means of the third valve.

3. The liquid-cooling heat dissipation system according to claim 1, wherein the first liquid-cooling tank body comprises:

a jet nozzle, configured to spray and cool the liquid cooling server in the first liquid-cooling tank body with the cooling liquid flowing out of a first liquid-cooling exchange port of the first liquid-cooling tank body or the first liquid storage tank, wherein the first liquid storage tank is connected to the jet nozzle by means of the first valve, the first liquid-cooling exchange port of the first liquid-cooling tank body is connected to the jet nozzle, the first liquid-cooling exchange port of the first liquid-cooling tank body is connected to a first input/output port of the heat exchanger by means of a fifth valve, a second liquid-cooling exchange port of the first liquid-cooling tank body is connected to the first input/output port by means of a sixth valve, and a second input/output port of the heat exchanger is connected with the second liquid-cooling tank body.

4. The liquid-cooling heat dissipation system according to claim 1, wherein a first liquid-cooling exchange port of the second liquid-cooling tank body is connected with a second input/output port of the heat exchanger, a second liquid-cooling exchange port of the second liquid-cooling tank body is connected with the first liquid storage tank, and the second liquid storage tank is connected with a third liquid-cooling exchange port of the first liquid-cooling tank body.

5. The liquid-cooling heat dissipation system according to claim 1, wherein that the vacuum port of the vacuum generator is connected with the first liquid-cooling tank body successively by means of a seventh valve and an eighth valve, the vacuum port of the vacuum generator is connected with the second liquid-cooling tank body successively by means of a ninth valve and a tenth valve, the vacuum port of the vacuum generator is connected with the first liquid storage tank successively by means of the ninth valve and an eleventh valve, and the vacuum port of the vacuum generator is connected with the second liquid storage tank successively by means of the seventh valve and a twelfth valve.

6. The liquid-cooling heat dissipation system according to claim 1, further comprising:

a processor connected with the heat exchanger and the vacuum generator and configured to control on/off of the heat exchanger and the vacuum generator.

7. The liquid-cooling heat dissipation system according to claim 1, further comprising: a flowmeter, configured to detect a flow rate of the cooling liquid flowing through the flowmeter, and the heat exchanger is connected with the second liquid-cooling tank body by means of the flowmeter.

8. The liquid-cooling heat dissipation system according to claim 1, wherein the first liquid-cooling tank body further comprises a first pressure sensor and a second pressure sensor;

wherein, the first pressure sensor is configured to detect a pressure in the first liquid-cooling tank body, and the second pressure sensor is configured to detect a pressure in the first liquid storage tank.

9. The liquid-cooling heat dissipation system according to claim 1, wherein the first liquid-cooling tank body further comprises a first liquid level indicator and a second liquid level indicator;

wherein, the first liquid level indicator is configured to detect a liquid level in the first liquid-cooling tank body, and the second liquid level indicator is configured to detect a liquid level in the first liquid storage tank.

10. The liquid-cooling heat dissipation system according to claim 1, wherein the first liquid-cooling tank body further comprises a first temperature sensor and a second temperature sensor;

wherein, the first temperature sensor is configured to detect a temperature in the first liquid-cooling tank body, and the second temperature sensor is configured to detect a temperature in the first liquid storage tank.

11. A liquid-cooling heat dissipation control method for servers, implemented by a liquid-cooling heat dissipation system comprising:

a heat exchanger, a vacuum generator, a first liquid-cooling tank body and a second liquid-cooling tank body for liquid cooling servers to be disposed therein respectively, wherein the liquid cooling server in the first liquid-cooling tank body is cooled in a spraying heat dissipation manner and the liquid cooling server in the second liquid-cooling tank body is cooled in an immersion heat dissipation manner;

wherein the first liquid-cooling tank body comprises a first liquid storage tank configured to store cooling liquid, the second liquid-cooling tank body comprises a second liquid storage tank configured to store the cooling liquid, the first liquid-cooling tank body is connected with the second liquid-cooling tank body by means of the heat exchanger, the first liquid storage tank is connected with the first liquid-cooling tank body by means of a first valve, the second liquid-cooling tank body is connected with the first liquid storage tank by means of a second valve, the second liquid storage tank is connected to the second liquid-cooling tank body by means of a third valve, the second liquid storage tank is connected with the first liquid-cooling tank body by means of a fourth valve, and the heat exchanger is configured to cool the cooling liquid flowing through the heat exchanger;

wherein a vacuum port of the vacuum generator is connected with the first liquid-cooling tank body and the second liquid-cooling tank body and the first liquid storage tank and second liquid storage tank, respectively, and the vacuum generator is configured to create and regulate:

vacuum degrees of the first liquid-cooling tank body, the second liquid-cooling tank body and the first liquid storage tank when the first valve and the second valve are opened and the third valve and the fourth valve are closed, whereby the cooling liquid circulates between the first liquid storage tank and the first liquid-cooling tank body and the second liquid-cooling tank body; and vacuum degrees of the second liquid storage tank and the first liquid-cooling tank body and second liquid-cooling tank body when the first valve and the second valve are closed and the third valve and the fourth valve are opened, whereby the cooling liquid circulates between the second liquid storage tank and the first liquid-cooling tank body and the second liquid-cooling tank body;

wherein the liquid-cooling heat dissipation control method comprises:

acquiring a heat dissipation starting instruction;

controlling the vacuum generator and the heat exchanger of the liquid-cooling heat dissipation system to start according to the heat dissipation starting instruction so as to control the vacuum generator to start, whereby the cooling liquid in the first liquid storage tank circulates between the first liquid-cooling tank body and the second liquid-cooling tank body and the first liquid storage tank;

wherein, the controlling the vacuum generator in the liquid-cooling heat dissipation system to start according to the heat dissipation starting instruction comprises:

controlling corresponding valves in the liquid-cooling heat dissipation system to be opened, and controlling the vacuum generator and the heat exchanger in the liquid-cooling heat dissipation system to start according to a starting mode in the heat dissipation starting instruction.

12. The liquid-cooling heat dissipation control method according to claim 11, wherein the controlling corresponding valves in the liquid-cooling heat dissipation system to be opened, and controlling the vacuum generator and the heat exchanger in the liquid-cooling heat dissipation system to start according to a starting mode in the heat dissipation starting instruction comprises:

in case where the starting mode in the heat dissipation starting instruction is a normal mode, controlling a first valve set in the liquid-cooling heat dissipation system to be opened, and controlling the vacuum generator and the heat exchanger in the liquid-cooling heat dissipation system and a first circulating pump in the first liquid storage tank to start, wherein the first valve set comprises the first valve, the second valve, a sixth valve, a seventh valve, an eighth valve, a ninth valve, a tenth valve, and an eleventh valve; and in case where the starting mode in the heat dissipation starting instruction is a spraying priority mode, controlling a second valve set in the liquid-cooling heat dissipation system to be opened, and controlling the vacuum generator and the heat exchanger in the liquid-cooling heat dissipation system and a second circulating pump in the second liquid storage tank to start, wherein the second valve set comprises the third valve, the fourth valve, a fifth valve, the seventh valve, the eighth valve, the ninth valve, the tenth valve, and a twelfth valve.

13. The liquid-cooling heat dissipation control method according to claim 11, wherein the first liquid storage tank comprises: a first circulating pump, configured to pump the cooling liquid in the first liquid storage tank to the first liquid-cooling tank body, and an outlet of the first circulating pump is connected to the first liquid-cooling tank body by means of the first valve; and the second liquid storage tank comprises: a second circulating pump, configured to pump the cooling liquid in the second liquid storage tank to the second liquid-cooling tank body, and an outlet of the second circulating pump is connected to the second liquid-cooling tank body by means of the third valve.

14. The liquid-cooling heat dissipation control method according to claim 12, wherein the first liquid-cooling tank body comprises:

a jet nozzle, configured to spray and cool the liquid cooling server in the first liquid-cooling tank body with the cooling liquid flowing out of a first liquid-cooling exchange port of the first liquid-cooling tank body or the first liquid storage tank, wherein the first liquid storage tank is connected to the jet nozzle by means of the first valve, the first liquid-cooling exchange port of the first liquid-cooling tank body is connected to the jet nozzle, the first liquid-cooling exchange port of the first liquid-cooling tank body is connected to a first input/output port of the heat exchanger by means of a fifth valve, a second liquid-cooling exchange port of the first liquid-cooling tank body is connected to the first input/output port by means of a sixth valve, and a second input/output port of the heat exchanger is connected with the second liquid-cooling tank body.

15. The liquid-cooling heat dissipation control method according to claim 12, wherein a first liquid-cooling exchange port of the second liquid-cooling tank body is connected with a second input/output port of the heat exchanger, a second liquid-cooling exchange port of the second liquid-cooling tank body is connected with the first liquid storage tank, and the second liquid storage tank is connected with a third liquid-cooling exchange port of the first liquid-cooling tank body.

16. The liquid-cooling heat dissipation control method according to claim 12, wherein that the vacuum port of the vacuum generator is connected with the first liquid-cooling tank body successively by means of a seventh valve and an eighth valve, the vacuum port of the vacuum generator is connected with the second liquid-cooling tank body successively by means of a ninth valve and a tenth valve, the vacuum port of the vacuum generator is connected with the first liquid storage tank successively by means of the ninth valve and an eleventh valve, and the vacuum port of the vacuum generator is connected with the second liquid storage tank successively by means of the seventh valve and a twelfth valve.

* * * * *